(12) United States Patent
Chidambarrao et al.

(10) Patent No.: US 7,741,186 B2
(45) Date of Patent: Jun. 22, 2010

(54) CREATING INCREASED MOBILITY IN A BIPOLAR DEVICE

(75) Inventors: Dureseti Chidambarrao, Weston, CT (US); Gregory G. Freeman, Hopewell Junction, NY (US); Marwan H. Khater, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 11/946,940

(22) Filed: Nov. 29, 2007

(65) Prior Publication Data

US 2008/0067631 A1 Mar. 20, 2008

Related U.S. Application Data

(62) Division of application No. 10/710,548, filed on Jul. 20, 2004, now Pat. No. 7,329,941.

(51) Int. Cl.
*H01L 21/8222* (2006.01)
(52) U.S. Cl. ............... 438/343; 257/586; 257/E29.174
(58) Field of Classification Search ........ 257/586, 257/E29.174; 438/343
See application file for complete search history.

(56) References Cited

U.S. PATENT DOCUMENTS

| | | | |
|---|---|---|---|
| 5,117,271 A | 5/1992 | Comfort et al. | |
| 6,448,124 B1 | 9/2002 | Coolbaugh et al. | |
| 6,531,369 B1 * | 3/2003 | Ozkan et al. | 438/312 |
| 6,639,256 B2 * | 10/2003 | U'Ren et al. | 257/197 |
| 6,667,489 B2 | 12/2003 | Suzumura et al. | |
| 6,780,725 B2 * | 8/2004 | Fujimaki | 438/313 |
| 7,060,549 B1 * | 6/2006 | Craig et al. | 438/199 |
| 7,102,205 B2 | 9/2006 | Chidambarrao et al. | |
| 2004/0104405 A1 * | 6/2004 | Huang et al. | 257/199 |
| 2005/0035470 A1 * | 2/2005 | Ko et al. | 257/900 |

OTHER PUBLICATIONS

Ghani et al.; A 90 nm High Volume Manufacturing Logic Technology Featuring Novel 45nm Gate Length Strained Silicon CMOS Transistors; Portland Technology Development, TCAD, QRE, Intel Corp.; Electron Devices Meeting-Tech Digest; Dec. 8-10, 2003, Hillsboro, OR.

(Continued)

*Primary Examiner*—Steven J Fulk
(74) *Attorney, Agent, or Firm*—Howard M. Cohn; H. Daniel Schnurmann (57) ABSTRACT

The mobility of charge carriers in a bipolar (BJT) device is increased by creating compressive strain in the device to increase mobility of electrons in the device, and creating tensile strain in the device to increase mobility of holes in the device. The compressive and tensile strain are created by applying a stress film adjacent an emitter structure of the device and atop a base film of the device. In this manner, the compressive and tensile strain are located in close proximity to an intrinsic portion of the device. A suitable material for the stress film is nitride. The emitter structure may be "T-shaped", having a lateral portion atop an upright portion, a bottom of the upright portion forms a contact to the base film, and the lateral portion overhangs the base film.

7 Claims, 7 Drawing Sheets

OTHER PUBLICATIONS

Rim et al., Fabrication and Mobility Characterics of Ultra-Thin Strained Si Directly on Insulator (SSDOI) MOSFETs; IBM Semiconductor Research and Development Center (SRDC), IEEE Electron Devices Meeting, Tech. Digest p. 517 (1995) Yorktown Heights, NY.

Rim, et al., Enhanced Hole Mobilities in Surface-channel Strained Si p-MOSFETs; Solid State Electronics Laboratory, Stanford University, IEEE Electron Devices Meeting, Tech Digest. pp. 47-52 (2003) Stanford, CA Now with Research Dvision, Yorktown Heights, NY.

Rucker, et al., SiGe: C BICMOS Technology with 3.6 Gate Delay; IHP Im Technologiepark 25, Frankfurt (Oder)., Germany - IEEE 2003.

* cited by examiner

CREATING INCREASED MOBILITY IN A BIPOLAR DEVICE

RELATED APPLICATIONS

This application is a divisional application of pending U.S. patent application Ser. No. 10/710,548 having a filing date of Jul. 20, 2004 and having a common assignee with the present invention.

BACKGROUND OF THE INVENTION

The invention relates to semiconductor device fabrication and, more particularly, to techniques for enhancing the performance of bipolar devices.

A bipolar device is a semiconductor device, the operation of which is based on the use of both majority and minority carriers (also referred to as "charge carriers"). The majority and minority carriers are either electrons or holes, depending on the polarity of the device.

An example of a bipolar device is the bipolar junction transistor (BJT) which is a transistor having three semiconductor regions referred to as emitter, base and collector. The emitter is a very high conductivity region which acts as a source of free carriers which are injected into the adjacent base region. The collector is a region which collects carriers from the base. The base region is sandwiched between the emitter and collector regions and generally controls the flow of free carriers between the emitter and the collector. A lesser flow of carriers of opposite polarity to those flowing from emitter to collector flows from the base to the emitter.

A conventional BJT is fabricated using one semiconductor material (Si) with differently doped regions. A heterojunction bipolar transistor (HBT) utilizes more than one semiconductor material, taking advantage of the different properties (e.g., bandgap) of the different materials—for example, SiGe in combination with Si. The additional (other than Si) material is formed as an epitaxial layer, typically using MBE (molecular beam epitaxy), RTCVD (rapid-thermal chemical vapor deposition), or LPCVD (low-pressure chemical vapor deposition) techniques.

A bipolar transistor comprises an emitter layer (or region) containing an impurity of a first conductivity type, a base layer (or region) containing an impurity of a second conductivity type, and a collector layer (or region) containing the impurity of the first conductivity type.

Bipolar transistors are typically of two distinct types, or polarity—either n-p-n (having n-type emitter and collector, and having p-type base), or p-n-p (having p-type emitter and collector, and having n-type base).

The "type" (p or n) is determined by impurities which are implanted or deposited during epitaxy into the semiconductor material. The impurity for p-type is boron (B) and for n-type, phosphorous (P), arsenic (As), antimony (Sb).

For a n-p-n type bipolar transistor, the free carriers injected from the emitter are electrons, and the carriers flowing from the base to emitter are holes. For a p-n-p type bipolar transistor, carrier types are the opposite. Often, electrons are preferred as the majority charge carriers rather than holes, since for carrier mobility ($\mu$) $\mu_n > \mu_p$, and for saturation velocity (v) $v_n > v_p$. Hence, n-type bipolar devices are typically preferred, where possible.

Figure 1:
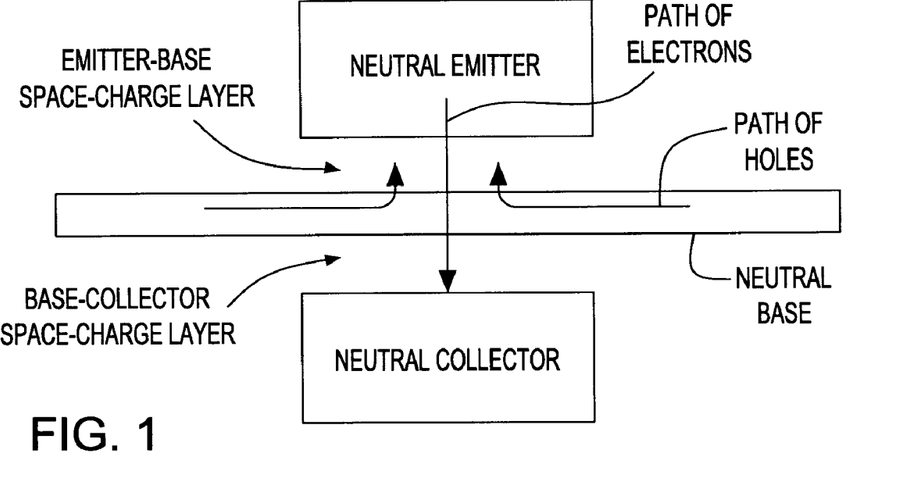
FIG. 1 is a schematic illustration of a BJT of the prior art, illustrating a generalized bipolar transistor structure and some fundamental principles of its operation, particularly charge flow.

FIG. 1 illustrates, generally, an n-p-n type BJT of the prior art comprising a neutral emitter, a neutral collector, and a neutral base disposed between the neutral emitter and neutral collector, illustrating the path of electrons from neutral emitter to neutral collector, via the base, and illustrating the path of holes from the neutral base to the neutral emitter. An emitter-base space charge layer (region) is formed between the neutral emitter and the neutral base. A base-collector space charge layer (region) is formed between the neutral base and the neutral collector. (For a p-n-p polarity BJT holes traverse between neutral emitter and neutral collector and electrons traverse between neutral base to neutral emitter.

Lattice strain is known to affect carrier mobility and saturation velocity. Various methods have been shown to cause strain in field effect transistors (FETs). For instance, films which cause tensile strain in the direction of current flow (and sometimes in the direction perpendicular to the direction of current flow) can improve the electron mobility and saturation velocity in FETs. It should be understood that FETs operate fundamentally differently than BJTs. For one thing, there is charge flow in only one direction, which is parallel to the wafer surface. In addition, FETs have a single carrier (electrons for NFET and holes for PFET), and so the application of lattice strain is straightforward to create strain in principally one direction for the single carrier type.

Some examples of employing strain techniques in FETs can be found in the following articles:

"A 90 nm High Volume Manufacturing Logic Technology Featuring Novel 45 nm Gate Length Strained Silicon CMOS Transistors", T. Ghani et al., Portland Technology Development, Intel Corp., Hillsboro, Oreg., 0-7803-7873 3/03 (c) 2003, IEEE describes the details of a strained transistor architecture which is incorporated into a 90 nm logic technology on 300 mm wafers.

The strained PMOS transistor structure features an epitaxially grown strained SiGe film embedded in the source drain regions. Dramatic performance enhancement relative to unstrained devices is reported. Ghani FIG. 1 shows a PMOS transistor with a strained epitaxial SiGe film embedded into the source drain region to induce compressive strain in the channel region.

"Enhanced Hole Mobilities in Surface-channel Strained-Si p-MOSFETs", K. Rim et al, Solid State Electronics Laboratory, Stanford University, Stanford, Calif. 94305, 0-7803-2700-4, (c) 1995, IEEE describes the strain dependence of the hole mobility in surface-channel p-MOSFETs employing pseudomorphic, strained-Si layers. The hole mobility enhancement is observed to increase roughly linearly with the strain as the Ge content in the relaxed $Si_{1-x}Ge_x$ buffer layer increases.

"Fabrication and Mobility Characteristics of Ultra-thin Strained Si Directly on Insulator (SSDOI) MOSFETs", K. Rim et al, T. J. Watson Research Center, Yorktown Heights, N.Y. 10598 0-7803-7873 3/03, IEEE discloses a tensile-strained Si layer transferred to form an ultra-thin (<20 nm) strained Si directly on insulator (SSDOI) structure. MOSFETs were fabricated, and electron and hole mobility enhancements were demonstrated on strained Si directly on insulator structures with no SiGe layer present under the strained Si channel.

SUMMARY OF THE INVENTION

Circuits benefit from ever increasing performance of the transistors. As mentioned above, MOSFET devices are finding increased performance from strained silicon lattice, which improves low field carrier mobility and thus the drive current in those devices. However, to the inventors' knowledge, strain has not yet been engineered into bipolar devices for increased performance. Wherein there are many methods so far described to impart strain into MOSFET devices, this field is largely unexplored for bipolar devices.

Bipolar device (BJT) performance is partly limited by carrier transit time through the space-charge regions and through the neutral base. Low field mobility and saturation velocity enhancements will benefit this transit time. The performance is also limited by extrinsic resistances in the base, emitter and collector regions. These resistance values are dominated by low field electron and hole mobility and will be affected by strain in the device. Compressive strain will benefit hole mobility, and tensile strain will benefit electron mobility. Applied in the correct locations in the device, strain will significantly improve performance.

Referring to FIG. 1, the performance of an n-p-n transistor could benefit from improving hole mobility in the lateral direction and improving electron mobility in vertical direction. In the opposite polarity case, a p-n-p transistor could benefit from improving electron mobility in the lateral direction and improving hole mobility in vertical direction.

According to the invention, generally, for an n-p-n BJT hole mobility in the lateral direction is improved by creating lateral compressive strain, and electron mobility in the vertical direction is improved by creating vertical tensile strain. For a p-n-p BJT electron mobility in the lateral direction is improved by creating lateral tensile strain, and hole mobility in the vertical direction is improved by creating vertical compressive strain.

In the main hereinafter, n-type (n-p-n) bipolar devices which are BJTs are discussed.

According to the invention, generally, tensile strain is applied to the intrinsic portion of the device (including the emitter, base and collector) in the direction of electron flow (vertical in the diagrams), and compressive strain is applied in the direction of hole flow (lateral in the diagrams), because holes flow principally in this direction within the base layers and improved hole mobility with compressive strain beneficially affects the resistance of the base terminal.

According to the invention, generally, a structure is formed wherein a tensile strain is applied in the intrinsic base of the device through an overlaying compressive stress nitride film.

This improves the intrinsic base resistance through enhanced hole mobility as described above. This also induces a vertical tensile strain in the direction of electron flow under the emitter of the device, enhancing the device electron flow and improving the electron transit time and emitter and collector access resistances.

According to the invention, a method of increasing mobility of charge carriers in a bipolar device comprises the steps of: creating tensile strain in the device to increase mobility of electrons in the device, and creating compressive strain in the device to increase mobility of holes in the device. The device is suitably a BJT. For a BJT which is an n-p-n transistor, hole mobility is increased in a lateral direction and electron mobility is increased in a vertical direction. For a BJT which is a p-n-p transistor, electron mobility is increased in a lateral direction and hole mobility is increased in a vertical direction.

The compressive and tensile strain are created by applying a stress film adjacent an emitter structure of the device and atop a base film of the device. In this manner, the compressive and tensile strain are located in close proximity to an intrinsic portion of the device. The strained film is disposed in close proximity to the intrinsic portion of the device. A suitable material for the strained film is nitride.

According to the invention, a bipolar device, comprises a collector region, a base film disposed atop the collector region, an emitter structure formed atop the base layer, and a stress film disposed adjacent the emitter structure and atop the base film. The stress film may be a tensile film or a compressive film, depending on the polarity of the bipolar device.

The emitter structure may be "T-shaped", having a lateral portion atop an upright portion, a bottom of the upright portion forms a contact to the base film, and the lateral portion overhangs the base film.

BRIEF DESCRIPTIONS OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGs.) of the drawing, in which case typically the last two significant digits may be the same, the most significant digit being the number of the drawing figure (FIG).

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. However, well-known processing steps may not be described in detail in order to avoid unnecessarily obfuscating the description of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula $SiO_2$. For example, silicon nitride (stoichiometrically $Si_3N_4$, often abbreviated as "SiN") may be referred to simply as "nitride".

In the description that follows, exemplary dimensions may be presented for an illustrative embodiment of the invention. The dimensions should not be interpreted as limiting. They may be included to provide a sense of proportion. Generally speaking, it is the relationship between various elements, where they are located, their contrasting compositions, and sometimes their relative sizes that is of significance.

Figure 2:
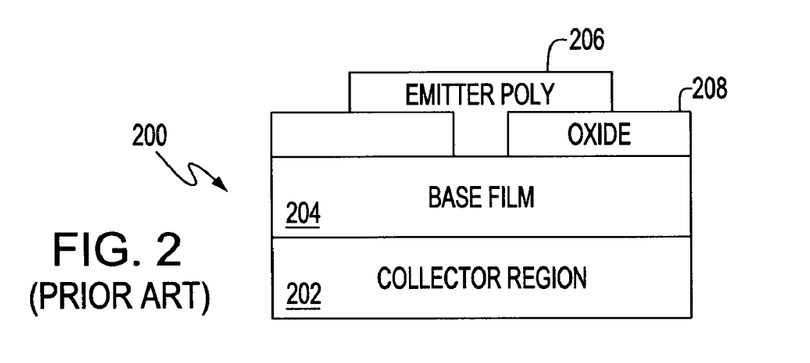
FIG. 2 is a simplified cross-sectional view of a BJT, illustrating a particular type of emitter structure, according to the prior art.

FIG. 2 illustrates a BJT 200 of the prior art, formed in a semiconductor substrate (not specifically shown). The BJT comprises a collector region 202, a base film 204 disposed atop the collector region 202 and an emitter structure 206 formed atop the base layer 208. This type of emitter structure is referred to a "T-shaped" emitter—it has a vertical (upright) portion atop which is a horizontal (lateral) portion. The emitter structure 206 is typically formed of polysilicon. The bottom of the upright portion of the emitter structure 206 forms a contact to the base film 204, and in a region surrounding this contact, the emitter polysilicon overhangs the base film 204 with an insulator 208 which is typically silicon dioxide. The device 200 is finished with steps (e.g., contact formation, etc.) well known to those knowledgeable in the state of the art. Examples of this type of BJT can be found, for example, in U.S. Pat. Nos. 5,117,271 and 6,667,489, and therefore require no further detailed discussion. In this example, the insulator 208 is adjacent the upright portion of the emitter structure 206, and on the surface of (atop) the base film 204.

Figure 3:
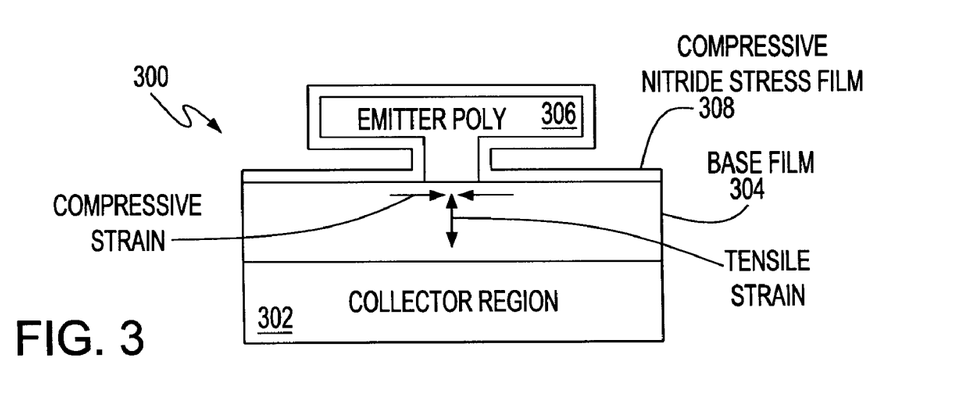
FIG. 3 is a simplified cross-sectional view of a BJT, fabricated according to the techniques of the present invention.

FIG. 3 illustrates a BJT 300, generally of the type illustrated in FIG. 2, but fabricated according to the techniques of the present invention. The BJT 300 comprises a collector region 302, a base film 304 disposed atop the collector region 302 and an emitter structure 306 formed atop the base layer 304. Generally, strain in the device is created by removing the insulator layer 208 and replacing it with (applying) a film 308 which creates strain(s) in the intrinsic region of the device. The "stress" film 308 preferably provides both compressive and tensile strain in this region. In this example, the film 308 is adjacent the upright portion of the emitter structure 306, and atop the base film 304. The film 308 is disposed in this region because it is in close proximity to the intrinsic portion of the device. (The intrinsic region of the device is the portion directly under the vertical portion of the emitter polysilicon, such that it encompasses the flow of carriers from the neutral emitter into the neutral collector. The portions that provide connectivity, i.e. the emitter polysilicon, the portion of the base layer not under the emitter polysilicon, and most of the collector layer are considered extrinsic).

For a n-type (n-p-n) BJT, the film 308 is a compressive film. Because of the T-shaped structure of the emitter and the location of the film 308—namely, adjacent the emitter structure and atop the base film, the film 308 imposes tensile strain in the vertical (as viewed) direction and compressive strain in the horizontal direction. (For a p-type (p-n-p) device, the film would be a tensile film, resulting in compressive strain in the vertical direction and tensile strain in the horizontal direction).

By removing the previous oxide film and replacing it with an intentionally stress film, the strain may be placed (located) in close proximity to the intrinsic portion of the device. The resultant increase in carrier mobility and saturation velocity has the effect of providing higher current drive and shorter transit time for improved RF device performance.

Generally, the oxide 208 is removed late in the process, and the film 308 is deposited as late in the process as possible so that strains will be preserved. A stress nitride film with at least 0.5 GPa (Giga-Pascal) intrinsic stress is suitable for use as the film 308.

AN EXEMPLARY EMBODIMENT

FIGS. 4, 4A-4F illustrate a sequence of steps used to form an embodiment of a BJT, according to the invention. FIG. 5 illustrates a complete BJT, formed according to the steps illustrated in FIGS. 4, 4A-4F.

Figure 4:
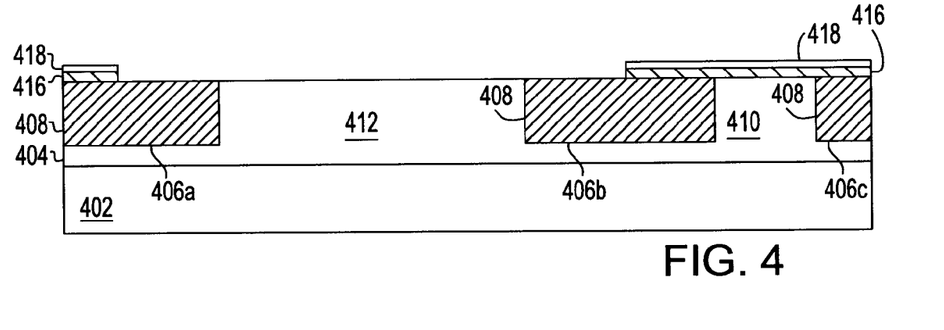
FIGS. 4, 4A-4F are cross-sectional views of a sequence of steps used to fabricate a BJT, according to the invention.
Figure 5:
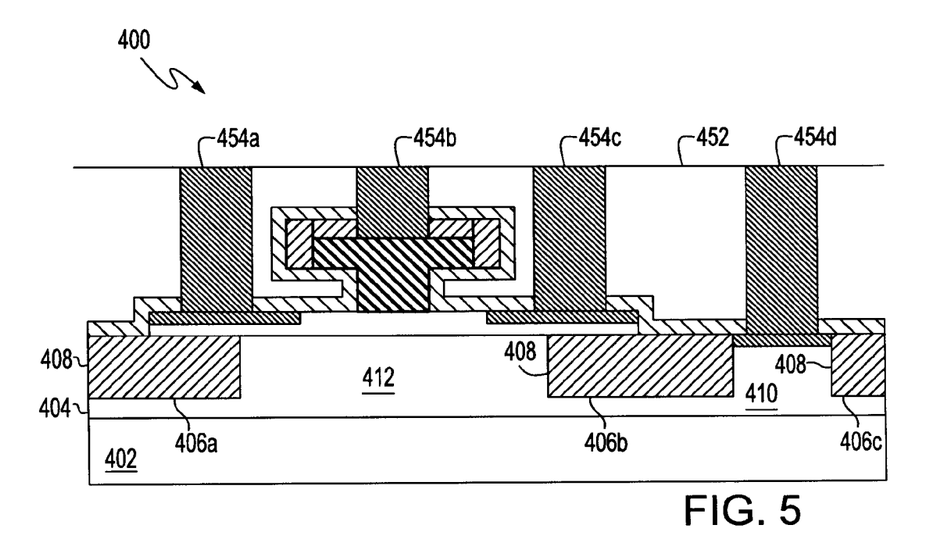
FIG. 5 is a cross-sectional view of a complete BJT, formed according to the steps illustrated in FIGS. 4, 4A-4F, according to the invention.

As shown in FIG. 4, a plurality of spaced-apart shallow trenches 406a, 406b and 406c are formed in a lightly doped (n−) epitaxial layer 404 of silicon semiconductor material which has been deposited on a heavily doped (n+) single crystal silicon semiconductor subcollector or substrate 402. The shallow trenches 406a, 406b and 406c are filled with an isolation oxide 408.

The isolation oxide 408 is suitably formed using well-known conformal oxide deposition and oxide polishing steps or other methods to bring the surface of oxide 408 to the same level as the surface of epitaxial layer 404. At this point, the rightmost upstanding portion or mesa 410 of layer 404, between trenches 406b and 406c, is subjected to an ion-implantation step which renders it heavily doped to the same concentration and conductivity type as substrate 402. The ion-implantation is suitably carried out using well-known lithographic and implantation steps. Upstanding portion or mesa 410 of layer 404 will ultimately form the subcollector reachthrough to substrate 402 which is the subcollector of the device of FIG. 4J. Leftmost upstanding portion or mesa 412 of layer 404, between the trenches 406a and 406b, will ultimately form the collector of the finished BJT.

Deep trenches (not shown) may optionally be formed. CMOS layers (not shown) may optionally be formed. (See, e.g., U.S. Pat. No. 6,448,124).

After the ion implantation of the mesas 410/412, a layer of etch-stop material (preferably silicon dioxide) 416 and a thin layer of polysilicon 418 are deposited on the surfaces of mesas 410 and 412 and on isolation oxide 408. This set of layers provides protection of mesa 410 from later processing and also provides a starting layer to promote growth of the epitaxy of the next step. A region corresponding to region 412 and overlapping regions 406a and 406b is defined through photolithography and the thin polysilicon layer 418 is etched, stopping on the thin etch-stop layer 416. Layers 416 is then etched, preferably with a wet etch process such as dilute HF, exposing the surface of mesa 412.

Figure 4A:
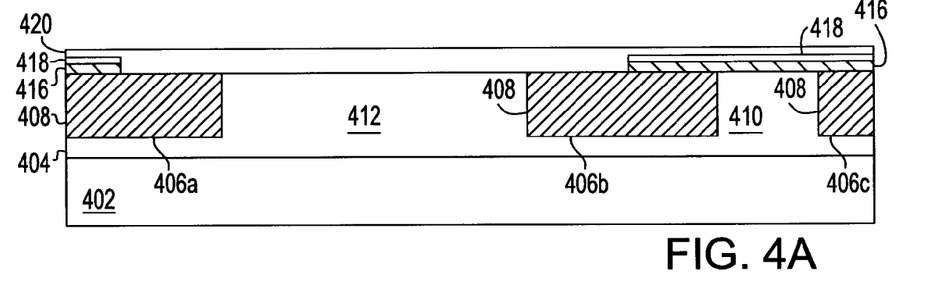

Next, as shown in FIG. 4A, a layer 420 of silicon semiconductor material is deposited on the surface of mesa 412 and on isolation oxide 408 using a nonselective epitaxial deposition technique. The layer 420 deposits as a polycrystalline material on the oxide 408, as single crystal material on the surface of mesa 412, and as polysilicon on the thin polysilicon layer remaining over 416. The layer 420 is undoped. Included in the layer 420 is a thin portion which is doped to have a p-type conductivity. The layer 420 will form the base of the BJT. The layer 420 may also include an alloy of Silicon Germanium (SiGe) in order to form a heterojunction bipolar transistor (HBT). This layer 420 has a thickness of approximately 10-50 nm, over the mesa 412 (in the openings), and over the layers 416 and 418.

Layer 420 may be deposited using any well-known epitaxial deposition technique which provides the desired polycrystalline and single crystal regions over oxide region 408 and mesas 410 and 412, respectively.

A preferred approach is to deposit layer 420 using a low temperature epitaxial (LTE) technique. Boron may be used as the p-conductivity type dopant and may have a doping concentration of $5 \times 10^{18}$-$5 \times 10^{19}$ cm$^{-3}$. In this way, the deposited layer 420 is formed of boron doped silicon or silicon/germanium by simply introducing the appropriate constituents during the deposition step in a well-known way.

Semiconductor substrate 402, layers 404, 418 and 420 are all preferably made of silicon semiconductor material. However, it should be appreciated that other semiconductor materials like gallium arsenide may also be used. Also, in FIG. 4A, the doped semiconductor regions such as substrate 402 and mesas 410, 412 are of n-conductivity type but these same regions may equally well be of p-conductivity type without departing from the spirit of the present invention. Typical n-conductivity type dopants are phosphorous, arsenic and antimony.

Figure 4B:
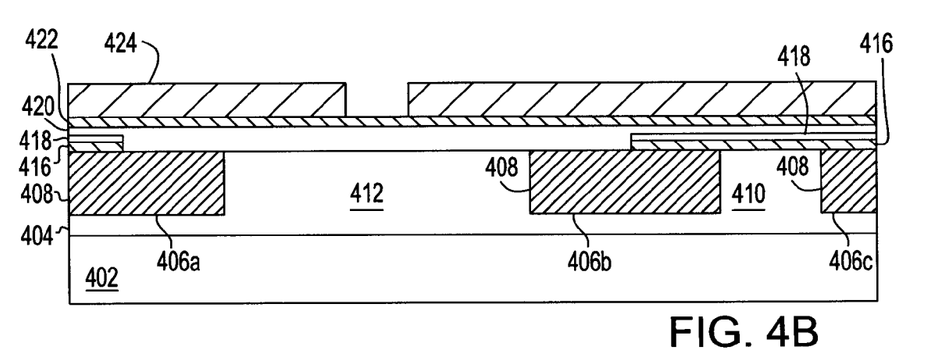

Next, as shown in FIG. 4B, after the deposition of layer 420, layers of oxide 422 and nitride 424 are deposited. These layers may be deposited in manners well-known to those skilled in the semiconductor fabrication art. The oxide layer 422, may alternatively be thermally grown using well-known prior art techniques provided oxidation takes place under conditions which do not lead to excessive diffusion of the intrinsic base dopant in layer 420 Next, the nitride layer 424 is opened up, using conventional lithography, to have an opening 426 where the emitter will be formed. The nitride 424 is suitably etched, using the underlying oxide 422 as an etch stop. Finally, (as shown in FIG. 4C), the oxide 422 is etched to expose the base layer 420 in the opening 426.

Figure 4C:
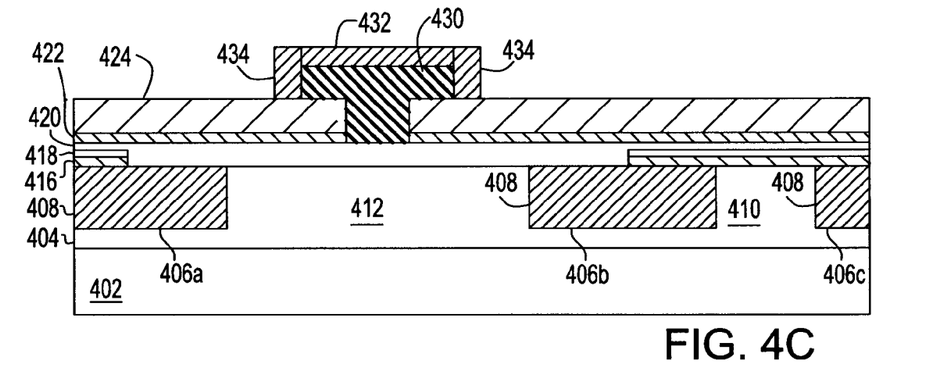

Next, as shown in FIG. 4C, the emitter 430 is formed by depositing and patterning polysilicon. For patterning the polysilicon, first a hard mask (e.g., oxide) 432 is deposited on the polysilicon, lithographically patterned, and etched, leaving polysilicon which is over, but wider than the opening 426. This results in the "T-shaped" emitter structure which is shown. Finally, oxide sidewall spacers 434 are deposited and etched. Note that the bottom of the emitter is in contact with the base layer 420.

Figure 4D:
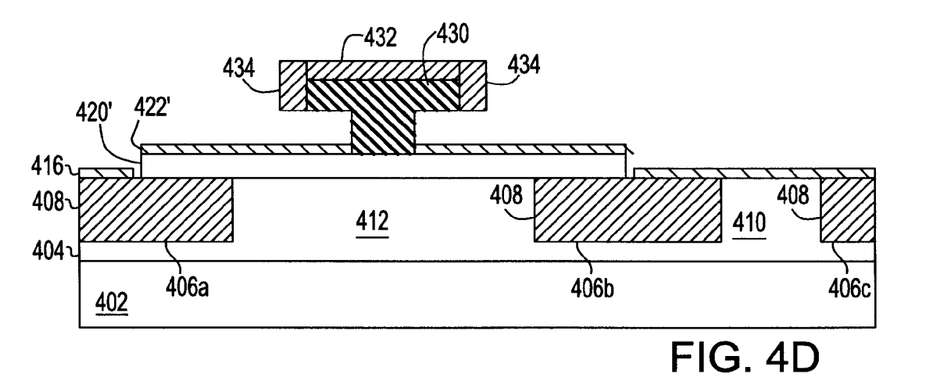

Next, as shown in FIG. 4D, the silicon nitride film 424 is removed, in its entirety. This may be done using a wet etch process such as hot-phosphoric etch, and results in the vertical portion and the underside of the horizontal portion of the "T-shaped" emitter being exposed. Finally, the silicon oxide 422 and the underlying base polysilicon 420 and silicon 418 are patterned and etched (and are labeled 422', 420' in this, and subsequent figures, respectively). The etch of the polysilicon film 420 and 418 uses the layer 416 as an etch stop layer, so that the reach through mesa region is not affected by this etch.

Figure 4E:
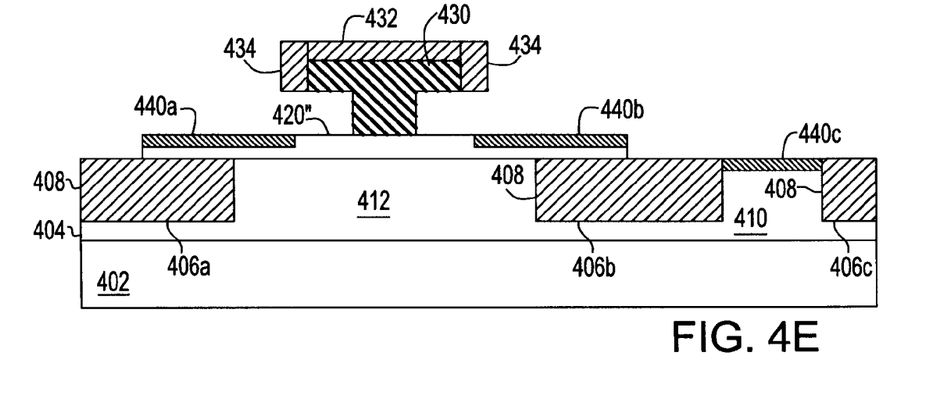

Next, as shown in FIG. 4E, oxide film 416 is etched away to expose layer 420' and the reach through region 410. Oxide layers 434 and 432 may be engineered with lower etch rate or with greater thickness such that they remain following the removal of layer 416. For instance, layer 416 may be deposited through an ozone TEOS process resulting in a high etch rate and layers 434 and 432 may be deposited with a CVD process that results in a lower etch rate. As also shown in FIG. 4E, silicide layers 440a 440b and 440c are formed through well known processes of metal sputter deposition, reaction and conversion. Because the silicide forms only on exposed silicon layers, it forms does not form on the oxide layers. Because the metal is deposited through a sputter process, it is not deposited beneath the overhanging regions of layer 430, leaving region 420" without silicide.

Figure 4F:
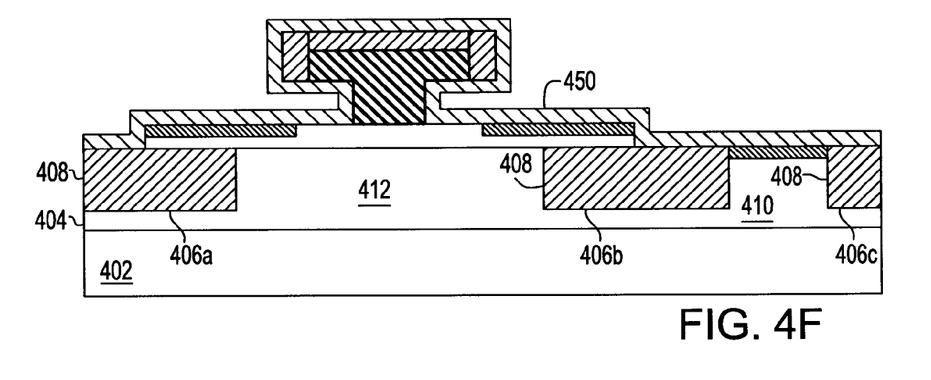

Next, as shown in FIG. 4F, a conformal stress film 450 (compare 308) is deposited, covering all exposed surfaces. This film is deposited typically with either a PECVD or an RTCVD process. In the case of the PECVD process, the stress is imposed through modifying the RF power of the deposition conditions and in the case of RTCVD the stress is imposed through modifying the precursor. To put things in perspective, exemplary approximate dimensions are:

width (lateral dimension) of the mesa 412: 300-1000 nm
width of the mesa 410: 200-700 n
thickness (vertical dimension) of the oxides 406a,b,c: 200-400 nm
overall height of the emitter: 100-200 nm
width of the emitter, at the top of the "T": 150-800 nm
thickness of the top portion of the "T": 50-100 nm
width of the vertical portion of the emitter: 50-200 nm
height of the vertical portion of the emitter: 50-100 nm
thickness of the base film 420 (420', 420"): 10-50 nm
thickness of the underlying film 422: 20-100 nm
thickness of the silicide 440: 20-60 nm
thickness of the stress film 450: 10-50 nm.

In a final set of steps, shown in FIG. 5, processing for the BJT device 400 is completed by fabricating middle of line (MOL) oxide dielectric 452 and electrodes 454a,b,c,d. The electrode 454a extends to silicide 440a. The hard mask 432 is opened up so that the electrode 454b can extend to the emitter 430. The electrode 454c extends to silicide 440b. The electrode 454d extends to the silicide 440c on the mesa 410.

As discussed above, for an n-p-n transistor the stress film 450 improves hole mobility in the lateral direction by creating lateral compressive strain, and improves electron mobility in the vertical direction is improved by creating vertical tensile strain. For a p-n-p transistor the stress film 450 improves electron mobility in the lateral direction by creating lateral compressive strain, and improves hole mobility in the vertical direction by creating vertical tensile strain.

As illustrated in FIG. 4F, the stress film is "notched", it does not fill the entire space below the horizontal top portion of the "T-shaped" emitter 430. This is of no particular significance, and the space could as well be filled.

However, it should be understood that the invention is equally applicable in the case of emitter structures which are simply rectangular (in cross-section), rather than T-shaped. (Picture, if you will, an emitter structure without the overhanging vertical portion.) What is generally important is that:

the stress film (450) is disposed adjacent the emitter and on the base layer,
the stress film extends laterally to the base contact electrodes 454a,c (FIG. 5),
the stress film contains an intrinsic stress of greater than 0.5 GPa.

Simulation Results

Figure 6:
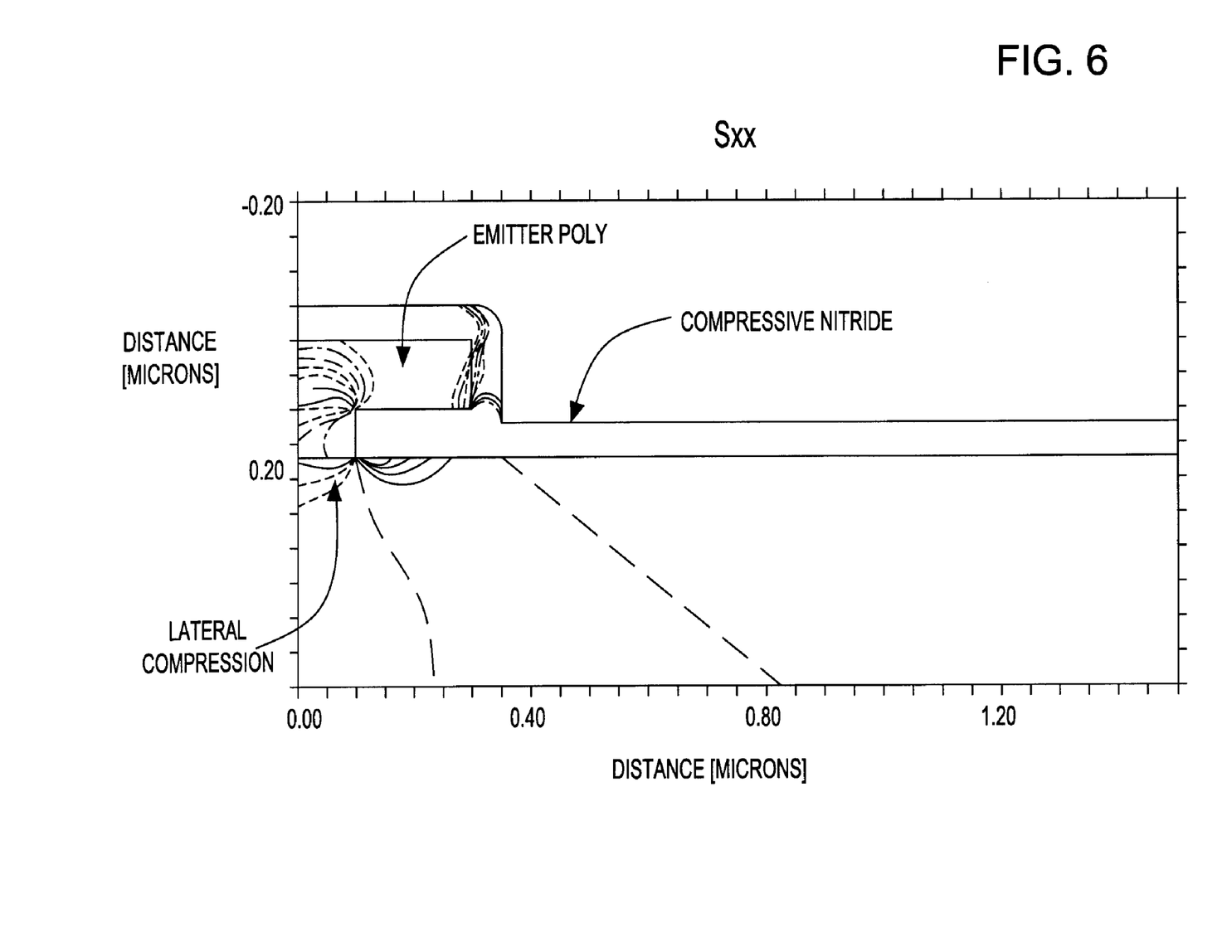
FIG. 6 is a diagram showing lateral stress in a BJT, according to the invention.
Figure 7:
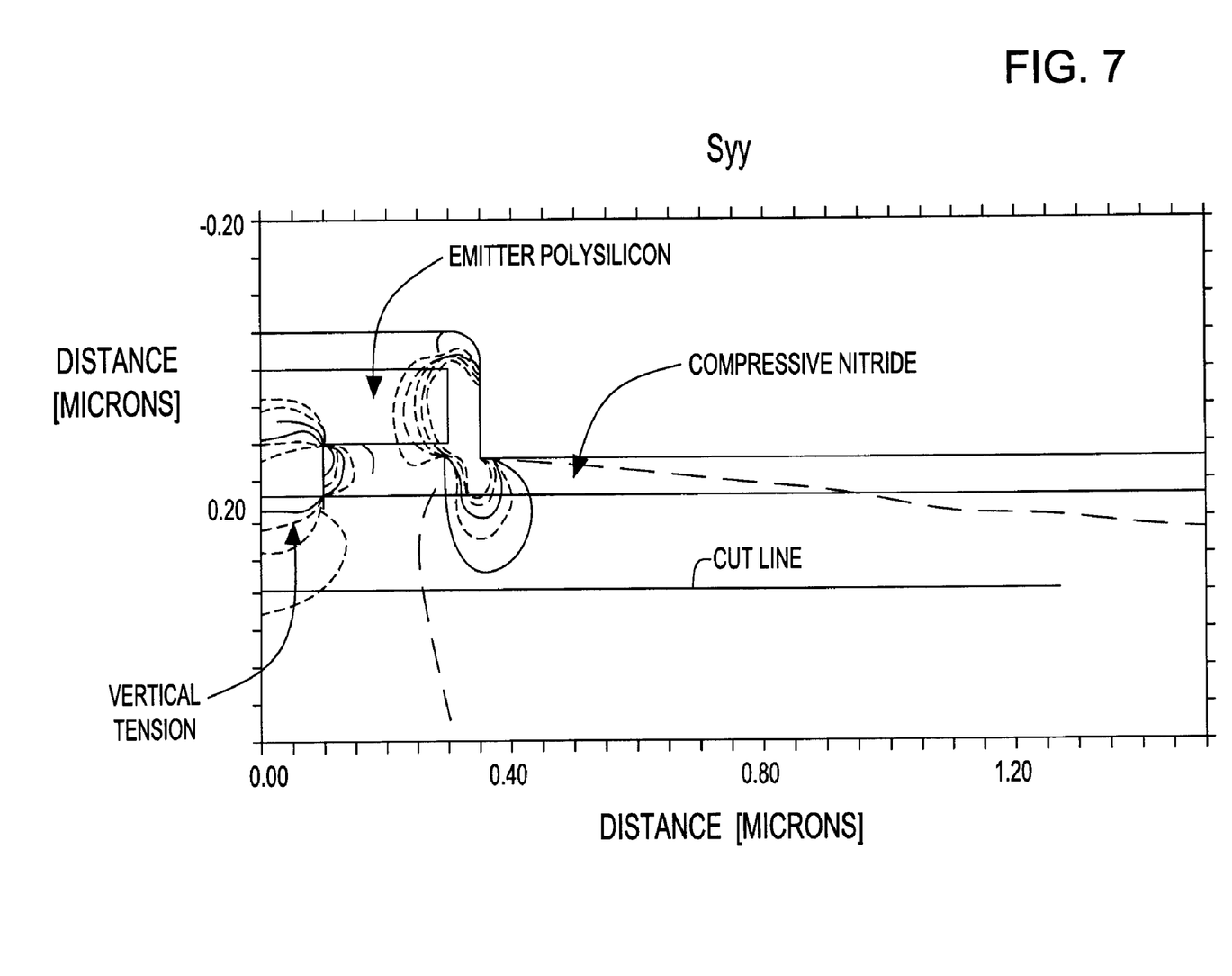
FIG. 7 is a diagram showing vertical stress in the BJT of FIG. 6, according to the invention.
Figure 8:
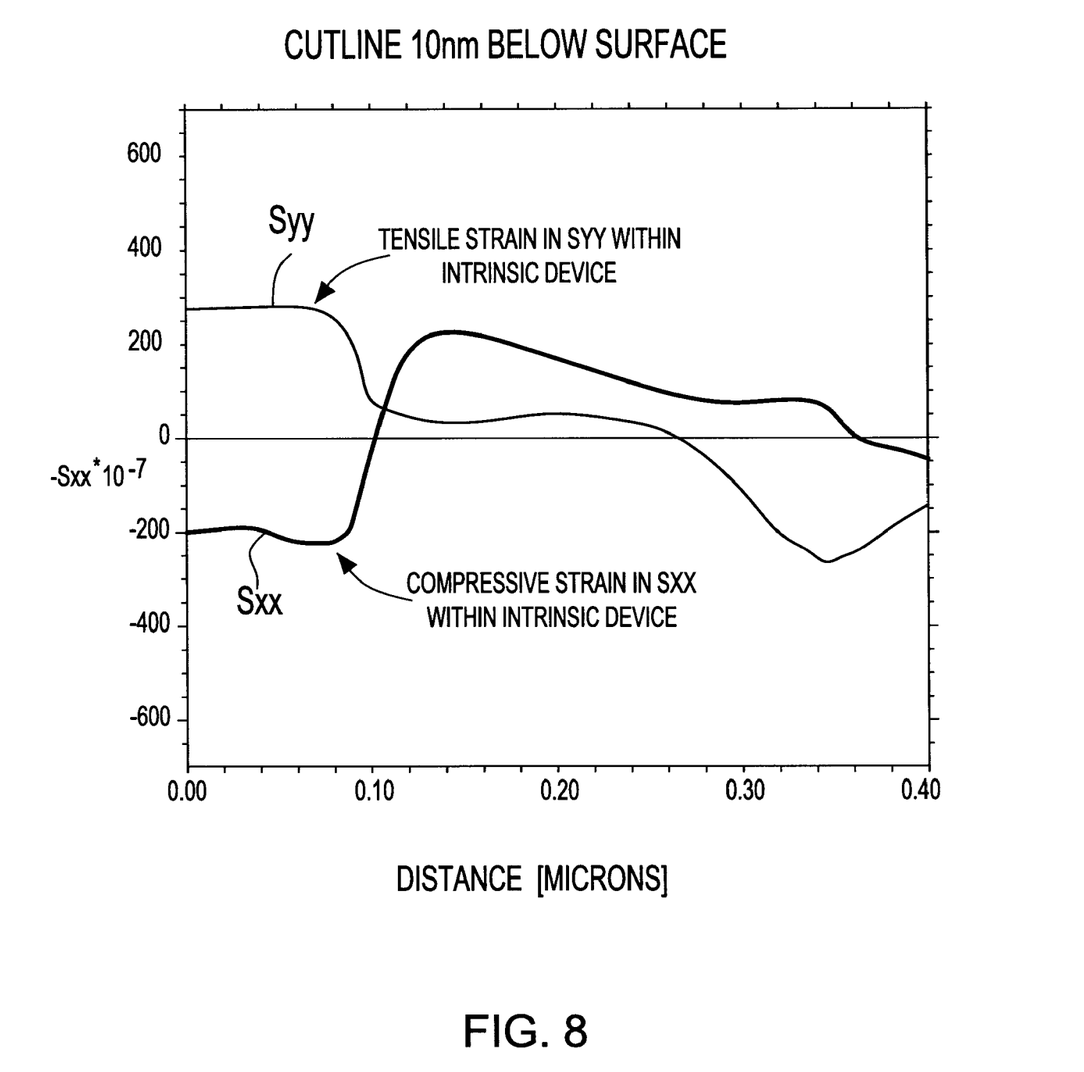
FIG. 8 is a graph illustrating stress in the BJT of FIG.>6, according to the invention.

The simulated effect of the stress film is shown in FIGS. 6-8.

FIG. 6 shows a cross section of one half the device region of interest. Both axes are in distances, in microns. Only half the device is shown for simulation efficiency. The compressively stressed nitride film is atop the base film. Iso-stress lines representing the lateral stress is shown in the structure. Underneath the vertical portion of the emitter layer the lateral stress is compressive with the greatest quantity of stress near the interface between the base film and the emitter film. Underneath the compressive nitride film the base layer is in tension, also with the greatest magnitude near the surface.

FIG. 7 shows the same structure as in FIG. 6, yet with the iso-stress lines representing the vertical stress. Both axes are in distances, in microns. Here, the base film underneath the emitter films is in vertical tension, with the greatest magnitude near the surface. FIG. 7 also shows a horizontal "cut line" which represents the location of stress quantification in the graph in FIG. 8.

FIG. 8 shows a graph of the stress at the location of the cutline. The horizontal axis is distance in microns, the vertical axis is in stress units. The positive values (above the horizontal line) represent a tensile stressed film. The negative values (below the horizontal line) represent a compressive stressed film. The edge of the intrinsic device (where the electrons flow vertically through this cutline) is at the dimension 0.10 microns.

The two sets of data represent the lateral stress (SXX) and the vertical stress (SYY), and it can be seen that there is vertical tensile stress and lateral compressive stress within the intrinsic portion of this device.

This demonstrates that the compressive nitride film has the desirable properties of creating vertical tensile stress and lateral compressive stress within the intrinsic portion of this device.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of increasing mobility of charge carriers in a bipolar device comprising the steps of:
    applying a conformal stress film atop and in direct contact with exposed surfaces of a base film, the base film being disposed atop a collector region of the bipolar device;
    applying the conformal stress film adjacent an emitter structure of the bipolar device and atop the base film;
    applying the conformal stress film to cover and be in direct contact with exposed surfaces of the emitter structure;
    creating compressive strain in the device with the conformal stress film to increase mobility of holes in the device; and
    creating tensile strain in the device with the conformal stress film to increase mobility of electrons in the device.

2. The method of claim 1 including the step of locating the compressive strain and the tensile strain in close proximity to an intrinsic portion of the bipolar device.

3. The method of claim 1, wherein the step of applying a conformal stress film comprises applying a conformal stress film of nitride.

4. The method of claim 1, wherein the step of applying a conformal stress film comprises applying a conformal stress film having at least 0.5 GPa intrinsic stress.

5. The method of claim 1, further including applying the conformal stress film via rapid-thermal chemical vapor deposition.

6. The method of claim 1 wherein the step of applying a conformal stress film adjacent an emitter structure of the bipolar device comprises applying a conformal stress film adjacent an emitter structure of an n-p-n transistor, whereby hole mobility is increased in a lateral direction and electron mobility is increased in a vertical direction.

7. The method of claim 1 wherein the step of applying a conformal stress film adjacent an emitter structure of the bipolar device comprises applying a conformal stress film adjacent an emitter structure of a p-n-p transistor, whereby electron mobility is increased in a lateral direction and hole mobility is increased in a vertical direction.

* * * * *